United States Patent
Shim et al.

(10) Patent No.: US 10,978,431 B2
(45) Date of Patent: Apr. 13, 2021

(54) SEMICONDUCTOR PACKAGE WITH CONNECTION SUBSTRATE AND METHOD OF MANUFACTURING THE SAME

(71) Applicant: SAMSUNG ELECTRONICS CO., LTD., Suwon-si (KR)

(72) Inventors: Jongbo Shim, Asan-si (KR); Ji Hwang Kim, Cheonan-si (KR); Chajea Jo, Yongin-si (KR); Sang-Uk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/287,249

(22) Filed: Feb. 27, 2019

(65) Prior Publication Data

US 2019/0378825 A1 Dec. 12, 2019

(30) Foreign Application Priority Data

Jun. 8, 2018 (KR) .................. 10-2018-0066049

(51) Int. Cl.
*H01L 25/10* (2006.01)
*H01L 23/00* (2006.01)
(Continued)

(52) U.S. Cl.
CPC ........ *H01L 25/105* (2013.01); *H01L 21/4853* (2013.01); *H01L 21/565* (2013.01);
(Continued)

(58) Field of Classification Search
CPC ......... H01L 25/10; H01L 23/00; H01L 23/31; H01L 23/538; H01L 21/48; H01L 21/56; H01L 25/00; H01L 25/105; H01L 24/16; H01L 24/48; H01L 24/20; H01L 23/3128; H01L 23/5386; H01L 2225/1094; H01L 21/4853; H01L 21/565; H01L 21/568; H01L 25/50; H01L 2225/1035; H01L 2225/1058; H01L 23/5389; H01L 23/49833; H01L 24/92; H01L 24/24; H01L 24/19; H01L 23/13; H01L 24/29; H01L 24/14; H01L 24/17; H01L 24/73; H01L 24/06; H01L 23/49816; H01L 24/32; H01L 24/05
(Continued)

(56) References Cited

U.S. PATENT DOCUMENTS

| | | |
|---|---|---|
| 7,894,203 B2 | 2/2011 | Kariya et al. |
| 8,471,376 B1 | 6/2013 | Liou et al. |
| 8,759,959 B2 | 6/2014 | Yim et al. |
| 9,190,401 B2 | 11/2015 | Yim et al. |
| 9,543,277 B1 | 1/2017 | Lee et al. |
| 9,831,214 B2 | 11/2017 | Chen et al. |
| 2008/0246135 A1* | 10/2008 | Wong .............. H05K 1/185 257/686 |

(Continued)

*Primary Examiner* — Alexander O Williams
(74) *Attorney, Agent, or Firm* — Lee IP Law, P.C.

(57) ABSTRACT

A semiconductor package includes a lower substrate, a connection substrate coupled to the lower substrate, the connection substrate having a lateral portion surrounding a cavity, and a first conductive pattern on a top surface of the lateral portion, a lower semiconductor chip on the lower substrate, the lower semiconductor chip being in the cavity of the connection substrate, and the lower semiconductor chip including a second conductive pattern on a top surface of the lower semiconductor chip, a bonding member connecting the first conductive pattern and the second conductive pattern to each other, and a top package on the first conductive pattern and the second conductive pattern.

18 Claims, 15 Drawing Sheets

(51) Int. Cl.
*H01L 23/31* (2006.01)
*H01L 23/538* (2006.01)
*H01L 21/48* (2006.01)
*H01L 21/56* (2006.01)
*H01L 25/00* (2006.01)

(52) U.S. Cl.
CPC ........ *H01L 21/568* (2013.01); *H01L 23/3128* (2013.01); *H01L 23/5386* (2013.01); *H01L 23/5389* (2013.01); *H01L 24/16* (2013.01); *H01L 24/20* (2013.01); *H01L 24/48* (2013.01); *H01L 25/50* (2013.01); *H01L 2225/1035* (2013.01); *H01L 2225/1058* (2013.01); *H01L 2225/1094* (2013.01)

(58) Field of Classification Search
USPC ......................................................... 257/686
See application file for complete search history.

(56) References Cited

U.S. PATENT DOCUMENTS

| | | | |
|---|---|---|---|
| 2010/0002405 A1* | 1/2010 | Hsu | H01L 23/367 361/764 |
| 2010/0032827 A1* | 2/2010 | Hsu | H01L 23/5384 257/692 |
| 2013/0127054 A1 | 5/2013 | Muthukumar et al. | |
| 2014/0048944 A1* | 2/2014 | Lin | H01L 23/485 257/773 |
| 2015/0001731 A1* | 1/2015 | Shuto | H01L 25/18 257/774 |
| 2017/0271241 A1 | 9/2017 | Marimuthu et al. | |
| 2018/0096968 A1* | 4/2018 | Lee | H01L 23/5389 |
| 2018/0337148 A1* | 11/2018 | Baek | H01L 23/66 |
| 2019/0164863 A1* | 5/2019 | Cho | H01L 24/02 |
| 2019/0164895 A1* | 5/2019 | Kim | H01L 24/19 |

\* cited by examiner

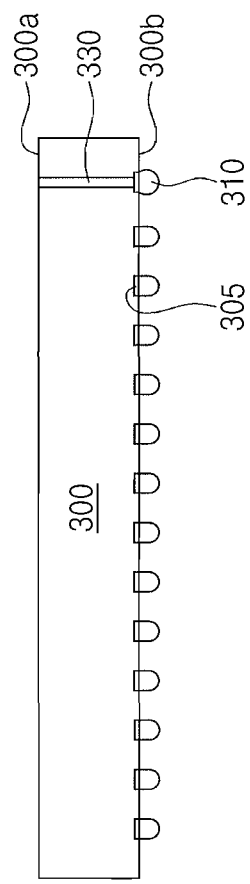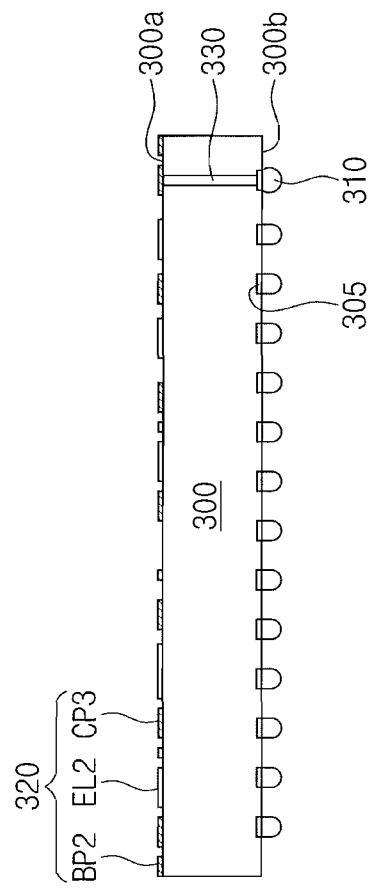

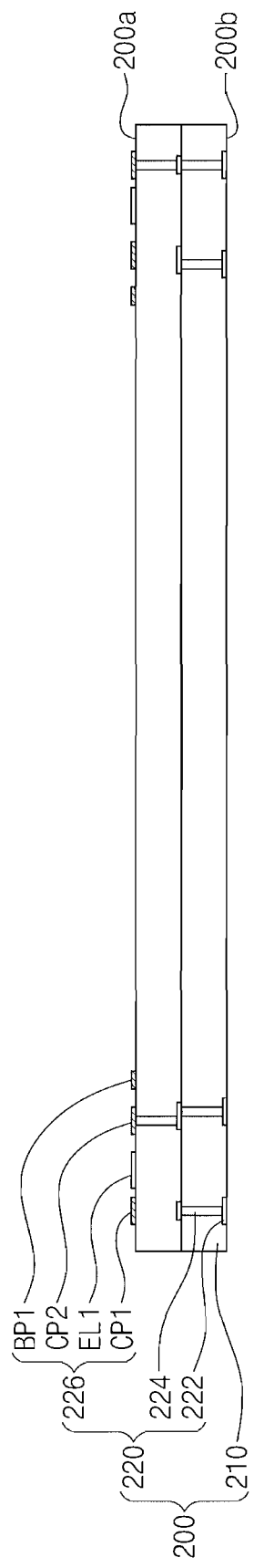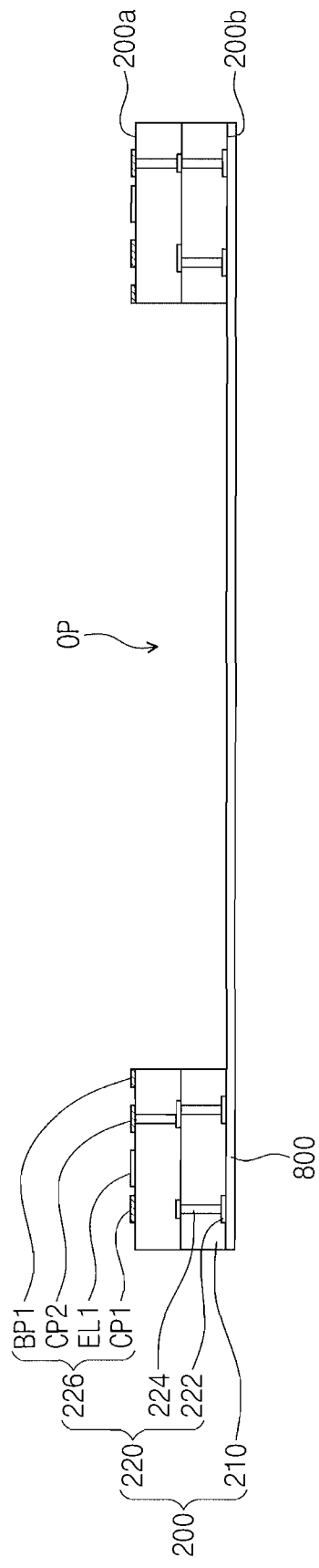

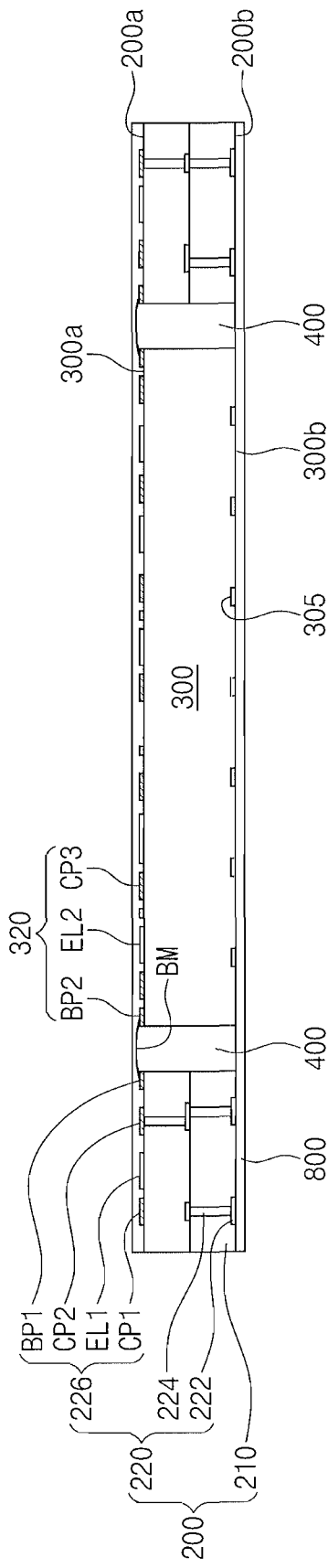
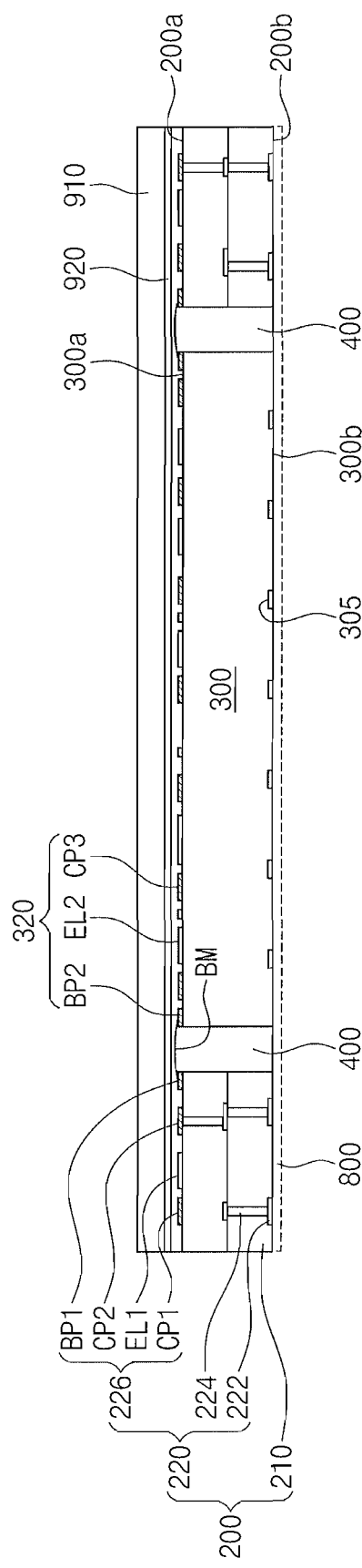

SEMICONDUCTOR PACKAGE WITH CONNECTION SUBSTRATE AND METHOD OF MANUFACTURING THE SAME

CROSS-REFERENCE TO RELATED APPLICATION

Korean Patent Application No. 10-2018-0066049 filed on Jun. 8, 2018, in the Korean Intellectual Property Office, and entitled: "Semiconductor Package and Method of Manufacturing the Same," is incorporated by reference herein in its entirety.

BACKGROUND

1. Field

The present disclosure relates to a semiconductor package and a method of manufacturing the same.

2. Description of the Related Art

A semiconductor package is provided to implement an integrated circuit chip to qualify for use in electronic products. In one type of a semiconductor package, a semiconductor chip is mounted on a printed circuit board and bonding wires or bumps are used to electrically connect the semiconductor chip to the printed circuit board. With the recent development of electronic industry, the semiconductor package is variously developed to reach the goal of compact size, small weight, and/or low manufacturing cost. In addition, many kinds of semiconductor packages also include, e.g., high-capacity mass storage devices.

SUMMARY

According to some example embodiments, a semiconductor package may include a lower substrate, a connection substrate coupled to the lower substrate, the connection substrate having a lateral portion surrounding a cavity, and a first conductive pattern on a top surface of the lateral portion, a lower semiconductor chip on the lower substrate, the lower semiconductor chip being in the cavity of the connection substrate, and the lower semiconductor chip including a second conductive pattern on a top surface of the lower semiconductor chip, a bonding member connecting the first conductive pattern and the second conductive pattern to each other, and a top package on the first conductive pattern and the second conductive pattern.

According to some example embodiments, a semiconductor package may include a connection substrate including a cavity in the connection substrate and a first conductive pattern on a top surface of the connection substrate, a semiconductor chip in the cavity and including a second conductive pattern, the semiconductor chip having an inactive surface on which the second conductive pattern is provided and an active surface facing the inactive surface, and a bonding member electrically connecting the first conductive pattern and the second conductive pattern to each other. The semiconductor chip and the second conductive pattern may be electrically insulated from each other. The connection substrate may further include a via that penetrates the connection substrate and is connected to the first conductive pattern.

According to some example embodiments, a method of manufacturing a semiconductor package may include providing a lower semiconductor chip including a first conductive pattern on an inactive surface of the lower semiconductor chip, providing a connection substrate including a cavity in the connection substrate and a second conductive pattern on a top surface of the connection substrate, providing the lower semiconductor chip and the connection substrate on a lower substrate to place the lower semiconductor chip in the cavity of the connection substrate, bonding the first conductive pattern and the second conductive pattern to each other, providing a top package including a plurality of connection terminals on a bottom surface of the top package, and mounting the top package on the lower semiconductor chip and the connection substrate to couple the connection terminals to the first conductive pattern and the second conductive pattern.

BRIEF DESCRIPTION OF THE DRAWINGS

Features will become apparent to those of skill in the art by describing in detail exemplary embodiments with reference to the attached drawings, in which:

FIGS. 6 to 12 illustrate cross-sectional views of stages in a method of manufacturing a semiconductor package according to some example embodiments.

FIGS. 16 to 23 illustrate cross-sectional views of stages in a method of manufacturing a semiconductor package according to some example embodiments.

DETAILED DESCRIPTION

Figure 1:
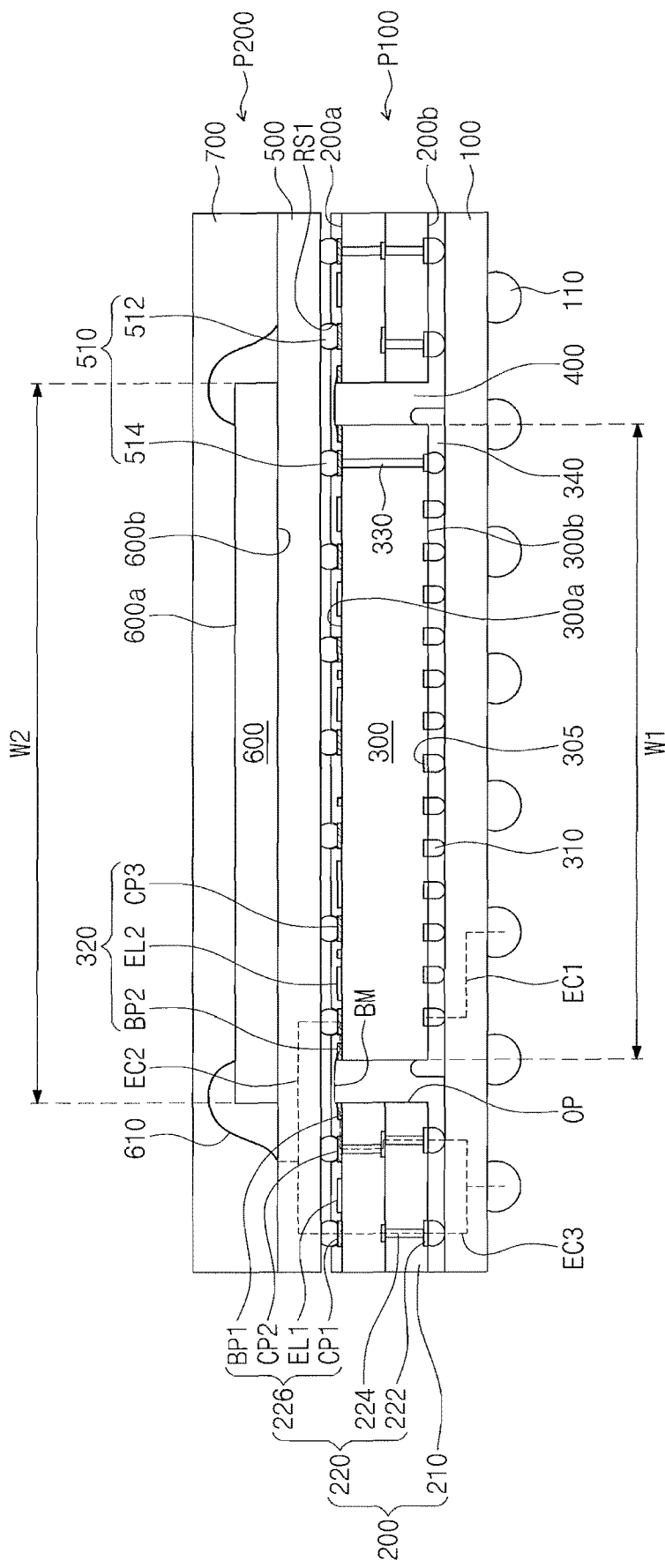
FIG. 1 illustrates a cross-sectional view of a semiconductor package according to some example embodiments.

The following describes a semiconductor package according to example embodiments with reference to the accompanying drawings. FIG. 1 illustrates a cross-sectional view of a semiconductor package according to some example embodiments.

Referring to FIG. 1, a bottom package P100 may be provided. The bottom package P100 may include a lower substrate 100, a connection substrate 200, a lower semiconductor chip 300, and a lower mold member 400.

For example, the lower substrate 100 may be or include a printed circuit board (PCB) provided on its top surface with signal patterns. In another example, the lower substrate 100 may have an alternating structure of a dielectric layer and a wiring line layer.

External terminals 110 may be disposed below the lower substrate 100, e.g., on a bottom surface of the lower substrate 100 that faces away from the lower semiconductor chip 300. The external terminals 110 may include solder balls or solder bumps, and based on type of the external terminals 110, the bottom package P100 may include one of a ball grid array (BGA) type, a fine ball-grid array (FBGA) type, and a land grid array (LGA) type.

The connection substrate 200 may be disposed on the lower substrate 100. The connection substrate 200 may be mounted on a top surface of the lower substrate 100, e.g., on a surface opposite the bottom surface of the lower substrate 100. For example, the connection substrate 200 may be mounted on the lower substrate 100 through solder bumps or solder balls. The connection substrate 200 may be electrically connected through the lower substrate 100 to the external terminals 110. In this description, the phrase "electrically connected/coupled" may include "directly or indirectly electrically connected/coupled."

The connection substrate 200 may include an opening OP, i.e., a cavity OP, that penetrates the connection substrate 200. For example, the opening OP may be shaped like an open hole, e.g., a cavity, that mutually connects bottom and top surfaces 200b and 200a of the connection substrate 200. For example, as illustrated in FIG. 1, the opening OP may penetrate through an entire thickness of the connection substrate 200, so a lateral portion of the connection substrate 200 may surround the opening OP, e.g., to provide a space to accommodate the lower semiconductor chip 300 to be explained in more detail below.

Figure 2:
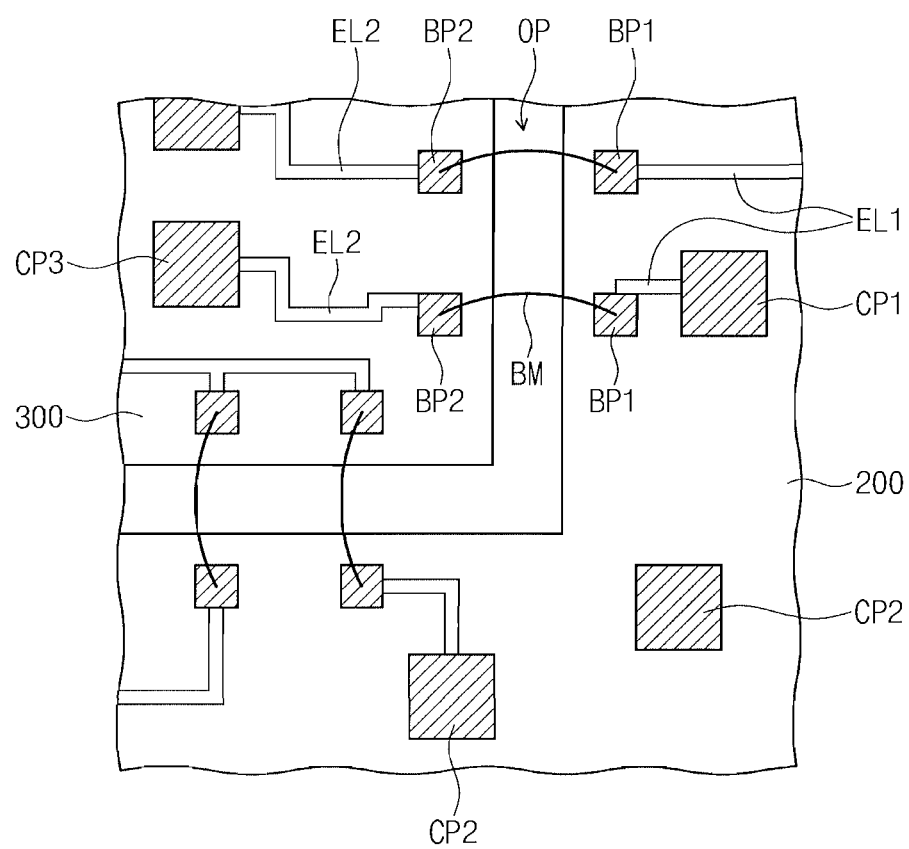
FIG. 2 illustrates a plan view of a first conductive pattern, a second conductive pattern, and a bonding member.

The connection substrate 200 may include a base layer 210 and a conductive member 220 in the base layer 210. The base layer 210 may include, e.g., silicon oxide. The conductive member 220 may occupy an outer, e.g., peripheral, side of the connection substrate 200, and the opening OP may occupy an inner, e.g., central, side of the connection substrate 200. For example, as illustrated in FIG. 1, the opening OP may penetrate through an entire thickness of the base layer 210, and the conductive member 220 may be positioned within and on surfaces of portions of the base layer 210 surrounding the opening OP, e.g., a lateral portion of the base layer 210 may surround the opening OP. For example, the base layer 210 of the connection substrate 200 may surround an entire perimeter of the opening OP (FIG. 2). The conductive member 220 may include connection substrate pads 222, connection substrate vias 224, and a first conductive pattern 226.

The connection substrate pads 222 may be disposed on a lower portion, e.g., on the bottom surface 200b, of the connection substrate 200. The connection substrate 200 may be electrically connected to the lower substrate 100 through solder balls or solder bumps that are disposed on the connection substrate pads 222. The connection substrate vias 224 may penetrate the base layer 210 and have an electrical connection with the connection substrate pads 222. The first conductive pattern 226 may be disposed on an upper portion, e.g., on the top surface 200a, of the connection substrate 200. The first conductive pattern 226 may include first pads CP1 mounted thereon with a top package P200 which will be discussed below, second pads CP2 coupled to the connection substrate vias 224, a first electrical line EL1, and a first bonding pad BP1. A circuit may be constituted by the first electrical line EL1, the first pads CP1, the second pads CP2, and the first bonding pad BP1. As shown in FIG. 1, the top package P200 may be mounted also on the second pads CP2. For example, the bottom package P100 may be configured such that the first pads CP1 have the same function as that of the second pads CP2. Example embodiments of the present disclosure, however, are not limited thereto.

The lower semiconductor chip 300 may be disposed on the lower substrate 100. As illustrated in FIG. 1, the lower semiconductor chip 300 may be positioned in, e.g., within, the opening OP of the connection substrate 200. When viewed in a plan view, the lower semiconductor chip 300 may have a planar shape smaller than that of the opening OP. For example, the lower semiconductor chip 300 may be spaced apart from an inner sidewall of the opening OP, e.g., the connection substrate 200 may surround a perimeter of the lower semiconductor chip 300 (FIG. 2).

The lower semiconductor chip 300 may have a bottom surface 300b facing the lower substrate 100 and a top surface 300a opposite to the bottom surface 300b. The bottom surface 300b of the lower semiconductor chip 300 may be an active surface, and the top surface 300a of the lower semiconductor chip 300 may be an inactive surface. The lower semiconductor chip 300 may be mounted on the top surface of the lower substrate 100. For example, the lower semiconductor chip 300 may be flip-chip bonded to the lower substrate 100. The lower semiconductor chip 300 may have a first circuit EC1 that is electrically connected to the lower substrate 100 through lower chip terminals 310, e.g., solder balls or solder bumps, that are disposed on lower chip pads 305. A flux 340 may fill a space between the lower semiconductor chip 300 and the lower substrate 100. The lower semiconductor chip 300 may be, e.g., a logic chip or a memory chip. The logic chip may include a logic part and a memory part. The memory chip may be or include, e.g., one or more of dynamic random-access memory (DRAM), NAND flash, NOR flash, phase-change random-access memory (PRAM), resistive random-access memory (ReRAM), and magnetoresistive random-access memory (MRAM). The lower semiconductor chip 300 may be electrically connected to the external terminals 110. FIG. 1 shows only one lower semiconductor chip 300, but the lower semiconductor chip 300 may be provided in plural.

The lower semiconductor chip 300 may include a second conductive pattern 320 on the top surface 300a serving as an inactive surface of the lower semiconductor chip 300. The top surface 300a of the lower semiconductor chip 300 may be located at the same level as that of the top surface 200a of the connection substrate 200, e.g., the top surfaces 300a and 200a may be coplanar. The second conductive pattern 320 may include third pads CP3 on which the top package P200 is mounted, a second electrical line EL2, and a second bonding pad BP2. The second electrical line EL2 may redistribute an electrical connection between the third pad CP3 and the second bonding pad BP2. The second conductive pattern 320 may have no direct electrical connection with the lower semiconductor chip 300, e.g., the lower semiconductor chip 300 and the second conductive pattern 320 may be electrically insulated from each other via the inactive top surface 300a.

For example, the lower semiconductor chip 300 may include a chip via 330 penetrating therethrough. The chip via 330 may extend from the top surface 300a toward the bottom surface 300b of the lower semiconductor chip 300. The chip via 330 may be coupled to one of the third pads CP3. The chip via 330 may also be coupled to the lower substrate 100. In such cases, the chip via 330 may electrically connect the second conductive pattern 320 to the lower substrate 100. In this configuration, the chip via 330 may not be coupled to, or may be electrically insulated from, the first circuit EC1 of the lower semiconductor chip 300. e.g., the first circuit EC1 of the lower semiconductor chip 300 and the chip via 330 may extend through opposite ends of the lower semiconductor chip 300. In another example, differently from FIG. 1, the lower semiconductor chip 300 may not include the chip via 330.

A bonding member BM may be provided. The bonding member BM may electrically connect the first bonding pad BP1 on the connection substrate 200 and the second bonding pad BP2 on the lower semiconductor chip 300 to each other. In some example embodiments, the bonding member BM may be or include a bonding wire. The second electrical line EL2 and the third pads CP3 may be electrically connected through the first and second bonding pads BP1 and BP2 and the bonding member BM to the connection substrate 200 and the lower substrate 100.

FIG. 2 is a plan view for explaining the first conductive pattern 226, the second conductive pattern 320, and the bonding member BM that are illustrated in FIG. 1, partially showing the lower semiconductor chip 300 and the connection substrate 200. Referring to FIG. 2, the first pads CP1, the second pads CP2, and the bonding pads BP1 of the connection substrate 200 may be electrically connected to each other by the first electrical line EL1. The third pads CP3 and the second bonding pads BP2 of the lower semiconductor chip 300 may be electrically connected to each other by the second electrical line EL2. The first and second bonding pads BP1 and BP2 may be electrically connected to each other by the bonding member BM. For convenience of description, FIG. 2 arbitrarily shows an arrangement of the pads CP1, CP2, and CP3 and of the bonding pads BP1 and BP2, but the present disclosure not limited thereto, e.g., one additional second pad CP2 may be positioned on the right side of FIG. 2 to be adjacent to the first pad CP1 and connected thereto via the first electrical line EL1 (as illustrated in FIG. 1).

Referring back to FIG. 1, the lower mold member 400 may be disposed on the lower substrate 100. The lower mold member 400 may fill a space between the connection substrate 200 and the lower semiconductor chip 300. The lower mold member 400 may cover the top surface 300a of the lower semiconductor chip 300 and the top surface 200a of the connection substrate 200. The lower mold member 400 may cover the first electrical line EL1, the second electrical line EL2, the first bonding pad BP1, the second bonding pad BP2, and the bonding member BM. The lower mold member 400 may have therein a first recess RS1 exposing the first and second pads CP1 and CP2 of the connection substrate 200 and the third pads CP3 of the lower semiconductor chip 300. The lower mold member 400 may include a polymer material, e.g., an Ajinomoto build-up film (ABF)®, an epoxy-based polymer, or a thermosetting resin.

Figure 3:
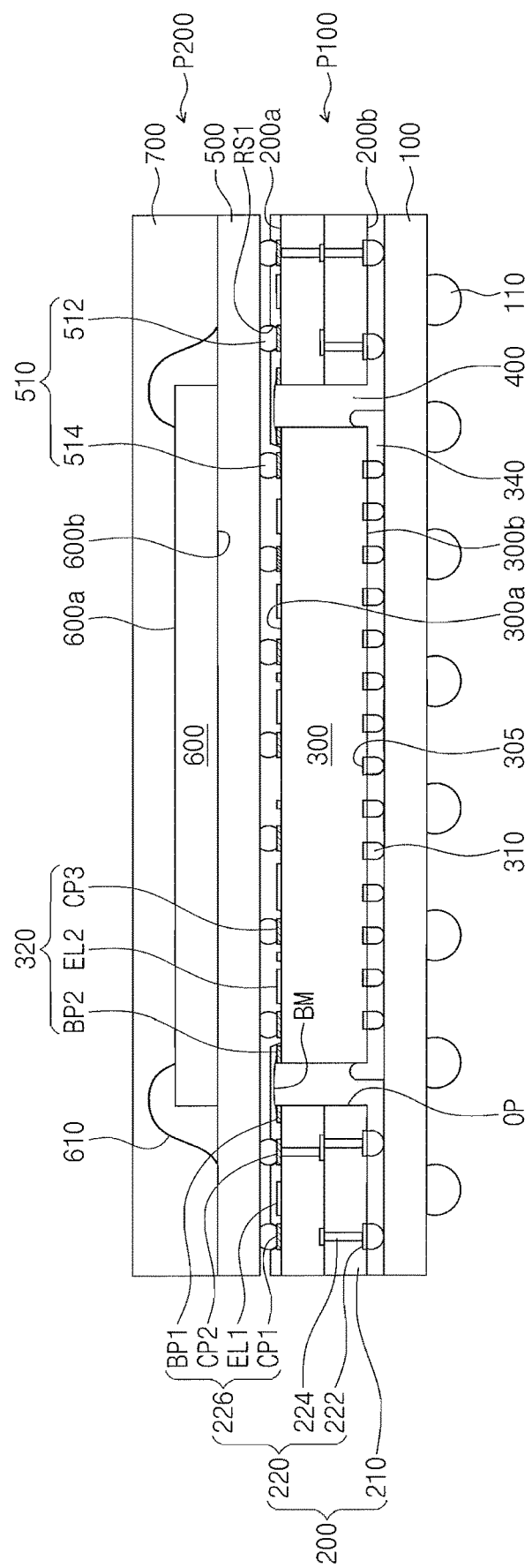
FIGS. 3 to 5 illustrate cross-sectional views of a semiconductor package according to some example embodiments.

In some example embodiments, the lower mold member 400 may expose the top surface 300a of the lower semiconductor chip 300. FIG. 3 illustrates a cross-sectional view showing a semiconductor package according to some example embodiments. As shown in FIG. 3, the lower mold member 400 may expose the second electrical line EL2 and the third pads CP3 on the top surface 300a of the lower semiconductor chip 300. In this case, the lower mold member 400 may bury the bonding member BM and the second bonding pad BP2 of the lower semiconductor chip 300.

Referring back to FIG. 1, the top package P200 may be provided on the bottom package P100. The top package P200 may include an upper substrate 500, an upper semiconductor chip 600, an upper mold member 700, and connection terminals 510.

For example, the upper substrate 500 may be or include a printed circuit board (PCB) provided on its top surface with signal patterns. In another example, the upper substrate 500 may have an alternating structure of a dielectric layer and a wiring line layer. The upper substrate 500 may have a width greater than a width W1 of the lower semiconductor chip 300, as illustrated in FIG. 1. The width of the upper substrate 500 may be the same as or less than a width of the lower substrate 100, but example embodiments are not limited thereto.

The upper semiconductor chip 600 may be disposed on the upper substrate 500. The upper semiconductor chip 600 may have a width W2 greater than the width W1 of the lower semiconductor chip 300. When viewed in a plan view, the upper semiconductor chip 600 may overlap the lower semiconductor chip 300 and also overlap a portion of the connection substrate 200, e.g., the upper semiconductor chip 600 may completely overlap the lower semiconductor chip 300 and the lower mold member 400 in the opening OP around the lower semiconductor chip 300. The upper semiconductor chip 600 may have a bottom surface 600b facing the upper substrate 500 and a top surface 600a opposite to the bottom surface 600b. The top surface 600a of the upper semiconductor chip 600 may be an active surface. The upper semiconductor chip 600 may be mounted on a top surface of the upper substrate 500. For example, the upper semiconductor chip 600 may be wire-bonded to the upper substrate 500. The upper semiconductor chip 600 may be electrically connected to the upper substrate 500 through, e.g., one or more bonding wires 610. The upper semiconductor chip 600 may be, e.g., a logic chip or a memory chip. The logic chip may include a logic part and a memory part.

The upper mold member 700 may be disposed on the upper substrate 500. The upper mold member 700 may cover the top surface of the upper substrate 500 and the top surface 600a of the upper semiconductor chip 600. The upper mold member 700 may include a polymer material, e.g., an Ajinomoto build-up film (ABF)®, an epoxy-based polymer, or a thermosetting resin.

The connection terminals 510 may be disposed below the upper substrate 500. The connection terminals 510 may include solder balls or solder bumps, and based on type of the connection terminals 510, the top package P200 may include one of a ball grid array (BGA) type, a fine ball-grid array (FBGA) type, and a land grid array (LGA) type. The upper semiconductor chip 600 may be electrically connected to the connection terminals 510.

The connection terminals 510 may include first connection terminals 512 and second connection terminals 514. The first connection terminals 512 may be provided on the connection substrate 200. The first connection terminals 512 may be coupled to the first pads CP1 of the connection substrate 200. The second connection terminals 514 may be provided on the lower semiconductor chip 300. The second connection terminals 514 may be coupled to the third pads CP3 of the lower semiconductor chip 300. The upper semiconductor chip 600 may be electrically connected through the upper substrate 500 to the first and second connection terminals 512 and 514. The upper semiconductor chip 600 may include a second circuit EC2 that is electrically connected to the external terminal 110 through the second connection terminal 514, the second conductive pattern 320, the bonding member BM, and the first conductive pattern 226, and also include a third circuit EC3 that is electrically connected to the external terminal 110 through the first connection terminal 512 and the first conductive pattern 226. The second and third circuits EC2 and EC3 may have no electrical connection with, or may be electrically insulated from, the first circuit EC1 of the lower semiconductor chip 300, e.g., the first connection terminals 512 may be electrically insulated from the lower semiconductor chip 300.

Figure 4:
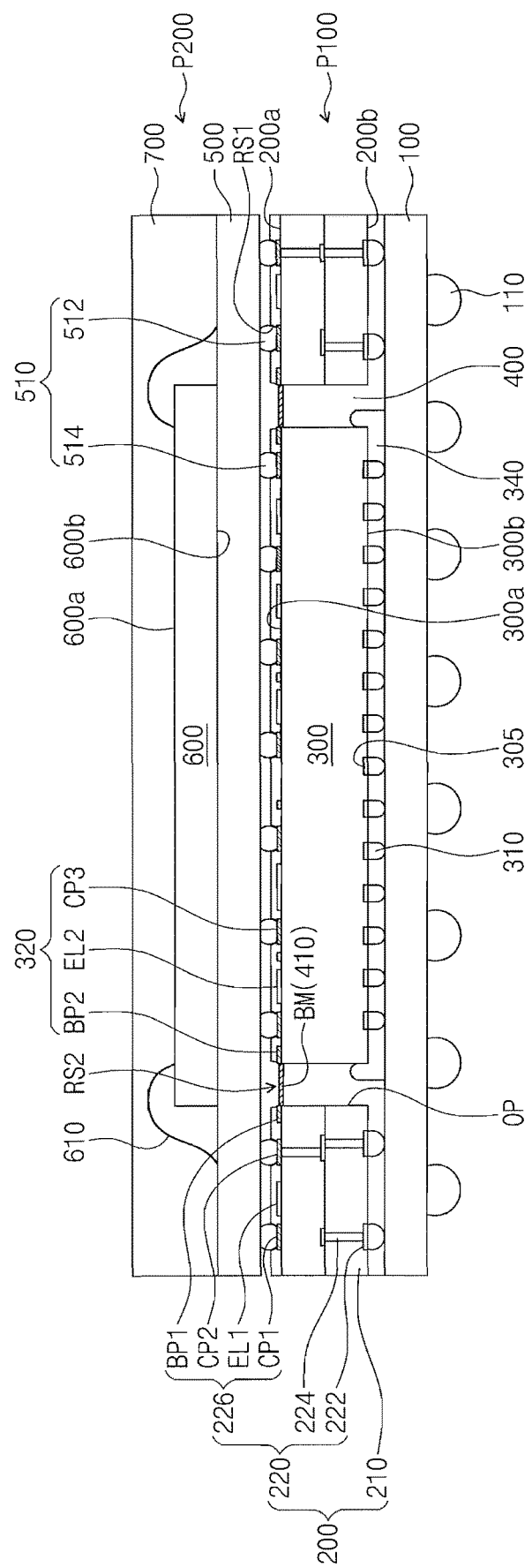
Figure 5:
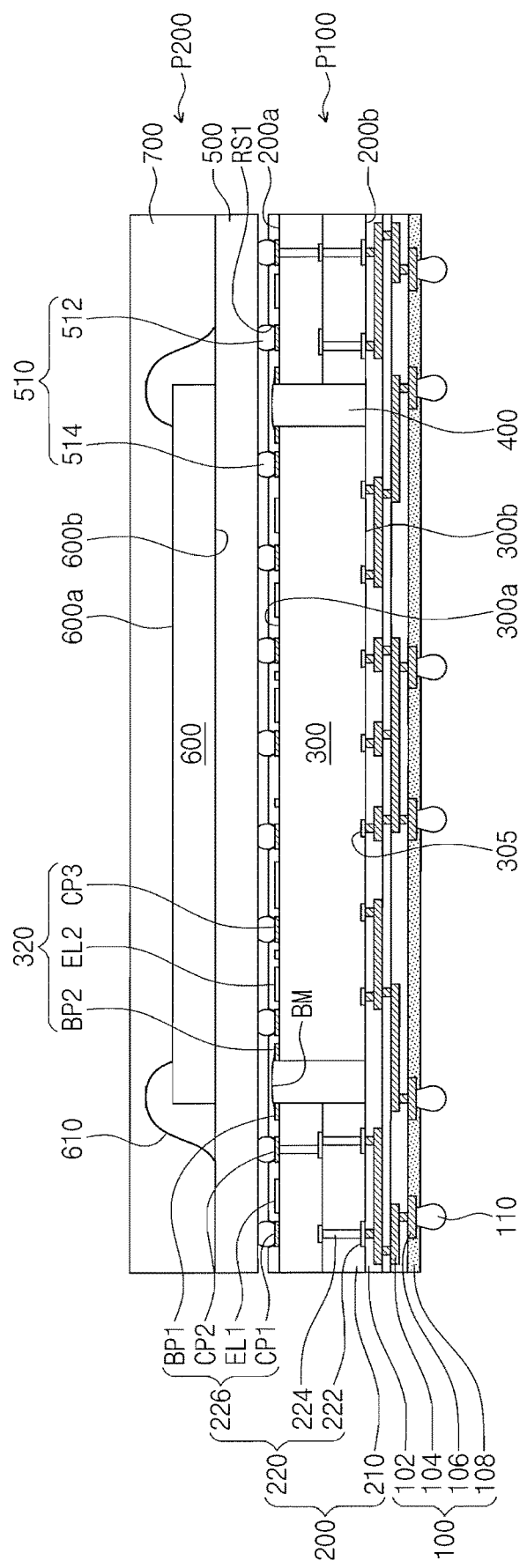

FIGS. 4 and 5 illustrate cross-sectional views showing a semiconductor package according to some example embodiments. Descriptions of elements in FIGS. 4-5 corresponding to reference numerals described previously with reference to FIGS. 1-3 are omitted or abbreviated for convenience of description.

Referring to FIG. 4, the bonding member BM may be provided. The bonding member BM may electrically connect the first bonding pad BP1 and the second bonding pad BP2 to each other. In some example embodiments, the bonding member BM may be or include a third conductive pattern 410. The third conductive pattern 410 may be disposed in a second recess RS2 of the lower mold member 400. The second recess RS2 may lie between the first and second bonding pads BP1 and BP2. For example, in the second recess RS2 of the lower mold member 400, the third conductive pattern 410 may have a shape extending from the first bonding pad BP1 to the second bonding pad BP2.

Referring to FIG. 5, the bottom package P100 may be a fan-out panel level package (PO-PLP). For example, the lower substrate 100 may be a redistribution substrate, i.e., a redistribution layer. The lower substrate 100 may include, e.g., dielectric layers 102 and conductive layers 104. The conductive layers 104 may include one or more vias penetrating the dielectric layers 102. For example, the dielectric layers 102 may include an inorganic insulating layer, e.g., a silicon oxide layer or a silicon nitride layer. In another example, the dielectric layers 102 may include a polymer material. The conductive layers 104 may be surrounded by or embedded in the dielectric layers 102. The conductive layers 104 may redistribute electrical connections between the lower chip pads 305 of the lower semiconductor chip 300 and the external terminals 110 of the lower substrate 100. The bottom package P100 may have a fan-out structure by the lower substrate 100. The conductive layers 104 may include metal. The conductive layers 104 may be connected to substrate pads 106 disposed on a bottom surface of the lower substrate 100. A passivation layer 108 may be provided on the bottom surface of the lower substrate 100. The passivation layer 108 may include an Ajinomoto build-up film (ABF)®, an organic material, an inorganic material, or an insulating polymer, e.g., an epoxy-based polymer. The external terminals 110 may be disposed on the bottom surface of the lower substrate 100. The external terminals 110 may be placed on the substrate pads 106. The external terminals 110 may be electrically connected through the substrate pads 106 to the conductive layer 104.

The lower substrate 100 may directly contact the bottom surface 200b of the connection substrate 200 and the bottom surface 300b of the lower semiconductor chip 300. For example, the lower substrate 100 may be in a direct contact with the lower chip pads 305 of the lower semiconductor chip 300 and with the connection substrate pads 222 of the connection substrate 200.

In semiconductor packages according to some example embodiments, the conductive patterns 226 and 320 may be provided on the top surface 200a of the connection substrate 200 and the top surface 300a of the lower semiconductor chip 300, and the top package P200 may be mounted on the conductive patterns 226 and 320. The connection terminals 510 of the top package P200 may all be disposed on the connection substrate 200 and the lower semiconductor chip 300. In such cases, the connection terminals 510 may be provided with an increased area for their locations, and as a result, the top package P200 may increase in the number of output terminals (e.g., the connection terminals 510) on the bottom package P100. The conductive patterns 226 and 320 may redistribute an electrical circuit of the top package P200, which may result in increasing the degree of freedom of wiring between the top package P200 and the bottom package P100. Thus, it may be possible to improve electrical characteristics of a semiconductor package.

Further, no additional substrate may be required for redistribution between the bottom package P100 and the top package P200, and accordingly, a semiconductor package may decrease in thickness. Even though no substrate is provided for redistribution, the top package P200 may redistribute its electrical connection by using the conductive patterns 226 and 320 having small thicknesses. A semiconductor package may therefore be advantageous to reduction in size.

A reduction in total thickness of a semiconductor package may allow the lower semiconductor chip 300 to have an increased thickness, and thus, the lower semiconductor chip 300 may have an advantage of heat radiation. Furthermore, heat generated from the lower semiconductor chip 300 may be discharged out through the conductive patterns 226 and 320. As a result, a semiconductor package may increase in heat radiation and operation stability.

FIGS. 6 to 12 illustrate cross-sectional views of stages in a method of manufacturing a semiconductor package according to some example embodiments.

Referring to FIG. 6, the lower semiconductor chip 300 may be provided. The lower semiconductor chip 300 may have the bottom surface 300b and the top surface 300a facing each other. The bottom surface 300b of the lower semiconductor chip 300 may be an active surface, and the top surface 300a of the lower semiconductor chip 300 may be an inactive surface. The lower semiconductor chip 300 may include the lower chip pads 305 disposed on the bottom surface 300b thereof. The lower semiconductor chip 300 may include the chip via 330 penetrating therethrough. The chip via 330 may extend from the top surface 300a toward the bottom surface 300b of the lower semiconductor chip 300. The lower chip terminals 310 may be attached to the lower chip pads 305.

Referring to FIG. 7, the second conductive pattern 320 may be formed on the top surface 300a of the lower semiconductor chip 300. For example, a conductive layer may be formed on the top surface 300a of the lower semiconductor chip 300, and then the conductive layer may be patterned to form the second conductive pattern 320. In another example, a shadow mask may be formed on the top surface 300a of the lower semiconductor chip 300, and then a conductive material may be deposited in a pattern of the shadow mask, which may result in the formation of the second conductive pattern 320. The pattern of the shadow mask may partially expose the top surface 300a of the lower semiconductor chip 300 and may define a zone where the second conductive pattern 320 is formed. The shadow mask may be removed after the second conductive pattern 320 is formed. The second conductive pattern 320 may include the third pad CP3, the second electrical line EL2, and the second bonding pad BP2.

Figure 8:
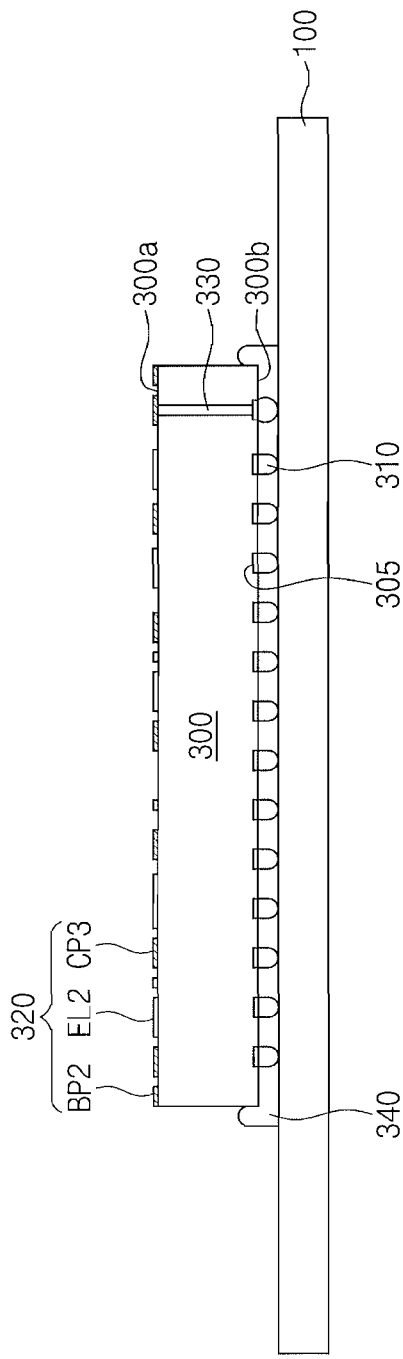

Referring to FIG. 8, the lower semiconductor chip 300 may be mounted on the lower substrate 100. The lower semiconductor chip 300 may be mounted in a flip-chip bonding manner. For example, the flux 340 may be coated on the bottom surface 300b serving as an inactive surface of the lower semiconductor chip 300, and then the lower semiconductor chip 300 may be positioned to cause the lower chip terminals 310 on the bottom surface 300b to face a top surface of the lower substrate 100. At this stage, the flux 340 may protrude onto a lateral surface of the lower semiconductor chip 300. The flux 340 may include a resin, an activator, and a solvent. The solvent may include, e.g., a glycol ether ester compound, a glycol ether compound, an ester compound, a ketone compound, or a cyclic ester compound. A reflow process may be performed on the lower chip terminals 310, and thus, the lower semiconductor chip 300 may be mounted on the lower substrate 100.

Figure 9:
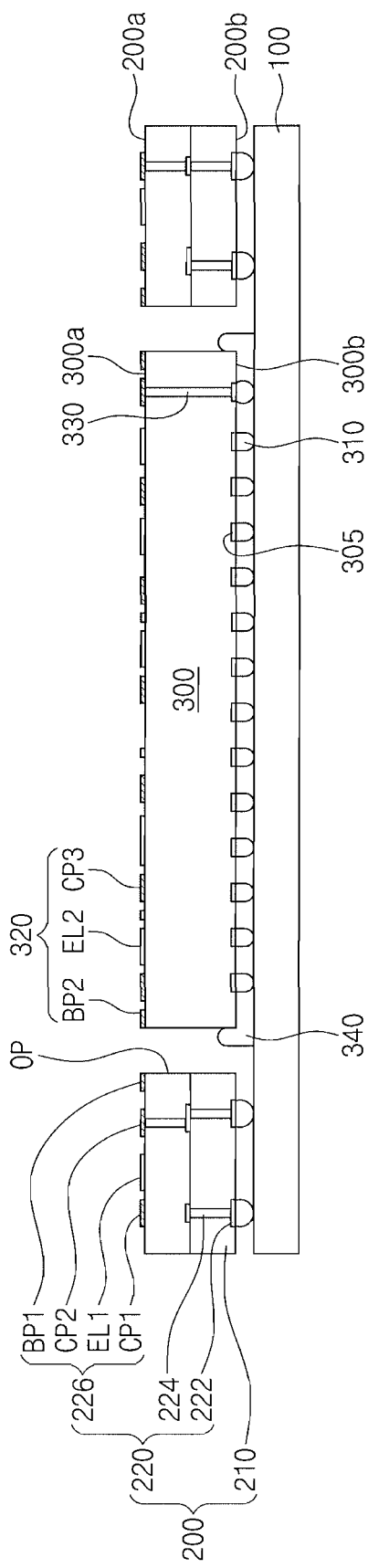

Referring to FIG. 9, the connection substrate 200 may be provided. The connection substrate 200 may include the base layer 210 and the conductive member 220 in the base layer 210. The conductive member 220 may include the connection substrate pads 222, the connection substrate vias 224, and the first conductive pattern 226. The first conductive pattern 226 may include the first pad CP1, the second pad CP2, the first electrical line EL1, and the first bonding pad BP1. For example, the base layer 210 may be etched and then its inside may be filled with a conductive material to form the connection substrate pads 222, the connection substrate vias 224, and the first conductive pattern 226.

The opening OP, also referred to as a cavity, may be formed in the connection substrate 200. For example, a portion of the connection substrate 200 may be removed to form the opening OP that penetrates, e.g., the entire thickness of, the connection substrate 200, e.g., a portion of the base layer 210 may be removed to provide the opening OP, i.e., a cavity, for accommodating the lower semiconductor chip 300. The opening OP may be formed by, e.g., an etch process such as drilling, laser ablation, or laser cutting.

The connection substrate 200 may be mounted on the lower substrate 100. At this stage, the connection substrate 200 may be disposed to place the lower semiconductor chip 300 in the opening OP, e.g., to have portions of the connection substrate 200 surround the lower semiconductor chip 300 in the opening OP. Solder balls or solder bumps on the connection substrate pads 222 may be reflowed to mount the connection substrate 200 on the lower substrate 100.

Figure 10:
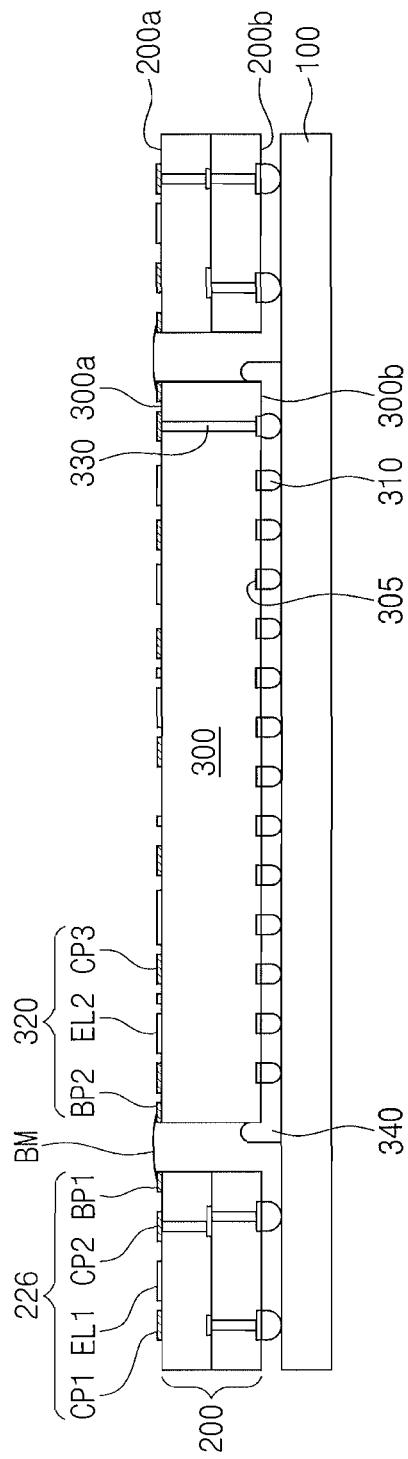
Figure 11:
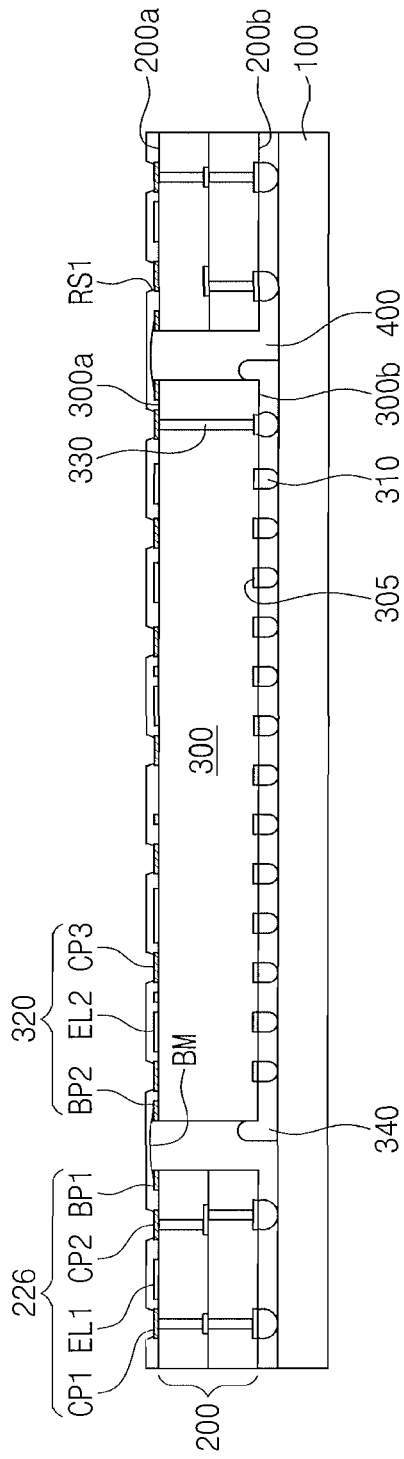

Referring to FIG. 10, the bonding member BM may be formed. For example, the first bonding pad BP1 of the connection substrate 200 and the second bonding pad BP2 of the lower semiconductor chip 300 may be connected to each other in a wire bonding manner. In some example embodiments, it may be desirable that the connection substrate 200 have the top surface 200a at the same level as that of the top surface 300a of the lower semiconductor chip 300, which configuration may easily achieve the wire bonding between the first bonding pad BP1 and the second bonding pad BP2.

Referring back to FIG. 11, the lower mold member 400 may be formed on the lower substrate 100. The lower mold member 400 may fill a space between the connection substrate 200 and the lower semiconductor chip 300. For example, an insulating substance may be injected into a space between the connection substrate 200 and the lower semiconductor chip 300, and then the insulating substance may be cured to form the lower mold member 400. The insulating substance may cover the first conductive pattern 226 of the connection substrate 200, the second conductive pattern 320 of the lower semiconductor chip 300, and the bonding member BM. The insulating substance may include an insulating polymer or a thermosetting resin.

For example, the lower mold member 400 may be etched to form a first recess RS1 that exposes the first pads CP1, the second pads CP2, and the third pads CP3. In another example, the lower mold member 400 may be etched to further expose the top surface 300a of the lower semiconductor chip 300. For example, the lower mold member 400 may expose the first pads CP1, the second pads CP2, the third pads CP3, and the second electrical line EL2 that is on the top surface 300a of the lower semiconductor chip 300. When the lower mold member 400 is formed to further expose the top surface 300a of the lower semiconductor chip 300, the semiconductor package of FIG. 3 may be manufactured. The following describes an example in which the lower mold member 400 selectively exposes the first, second, and third pads CP1, CP2, and CP3.

Figure 12:
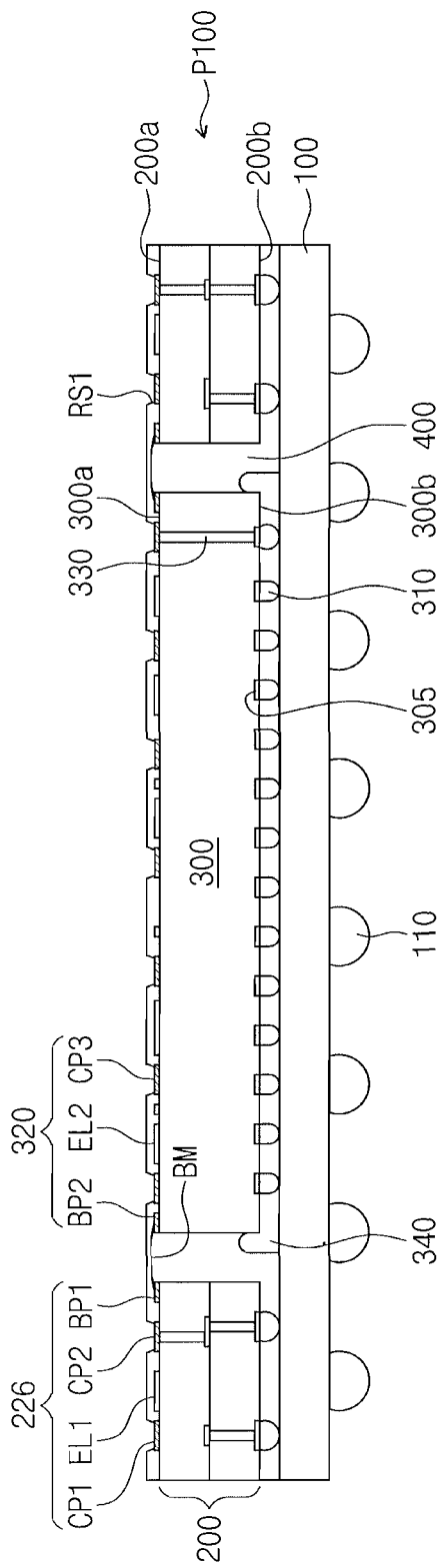

Referring to FIG. 12, the external terminals 110 may be formed on the bottom surface of the lower substrate 100. The external terminals 110 may include solder balls or solder bumps. The external terminals 110 may be electrically connected to the first and second conductive patterns 226 and 320 through the lower substrate 100, the conductive member 220 of the connection substrate 200, and the bonding member BM. The bottom package P100 may be formed through the processes mentioned above.

Referring back to FIG. 1, the top package P200 may be provided on the bottom package P100. The top package P200 may include the upper substrate 500, the upper semiconductor chip 600, the upper mold member 700, and the connection terminals 510. The upper substrate 500 may be or include a printed circuit board (PCB) provided on its top surface with signal patterns. The upper semiconductor chip 600 may be mounted on the upper substrate 500. The upper mold member 700 may cover a top surface of the upper substrate 500 and the top surface 600a of the upper semiconductor chip 600. The connection terminals 510 may be disposed below the upper substrate 500. The connection terminals 510 may include the first connection terminals 512 and the second connection terminals 514. The second connection terminals 514 may be farther away than the first connection terminals 512 from a location below an edge of the upper substrate 500.

The bottom package P100 and the top package P200 may align with each other to place the first connection terminals 512 on the first conductive pattern 226 and to place the second connection terminals 514 on the second conductive pattern 320. The first connection terminals 512 and the second connection terminals 514 may be in contact with the first conductive pattern 226 and the second conductive pattern 320, respectively, and then may be reflowed to mount the top package P200 on the bottom package P100. Through the processes mentioned above, the semiconductor package of FIG. 1 may be manufactured.

Figure 13:
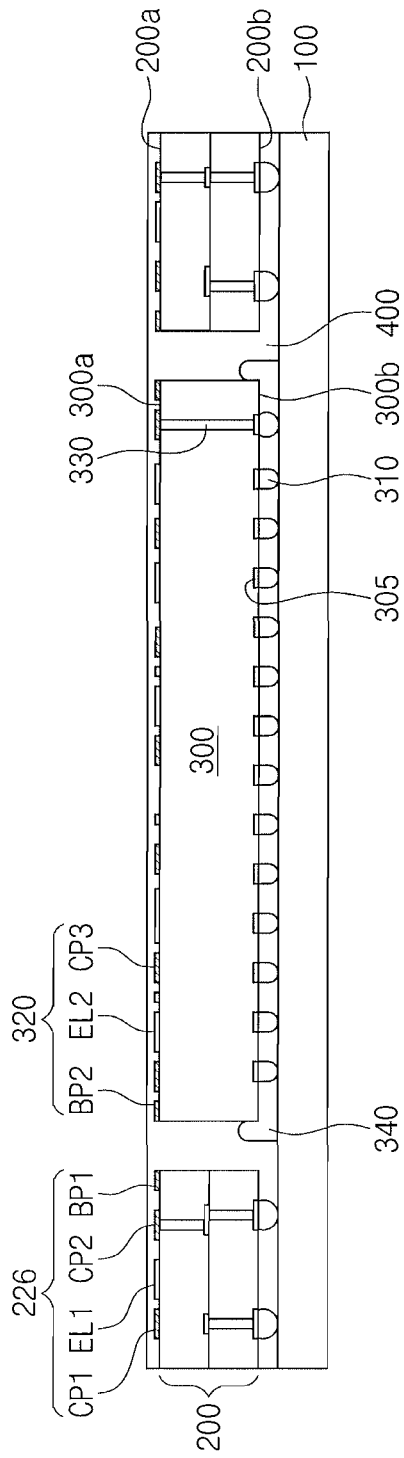
FIGS. 13 to 15 illustrate cross-sectional views of stages in a method of manufacturing a semiconductor package according to some example embodiments.
Figure 14:
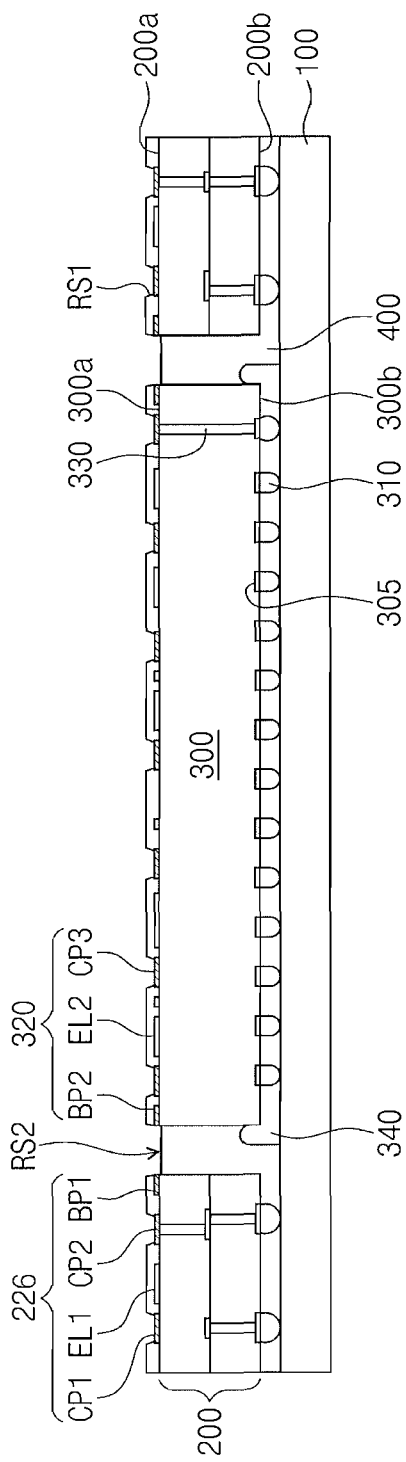
Figure 15:
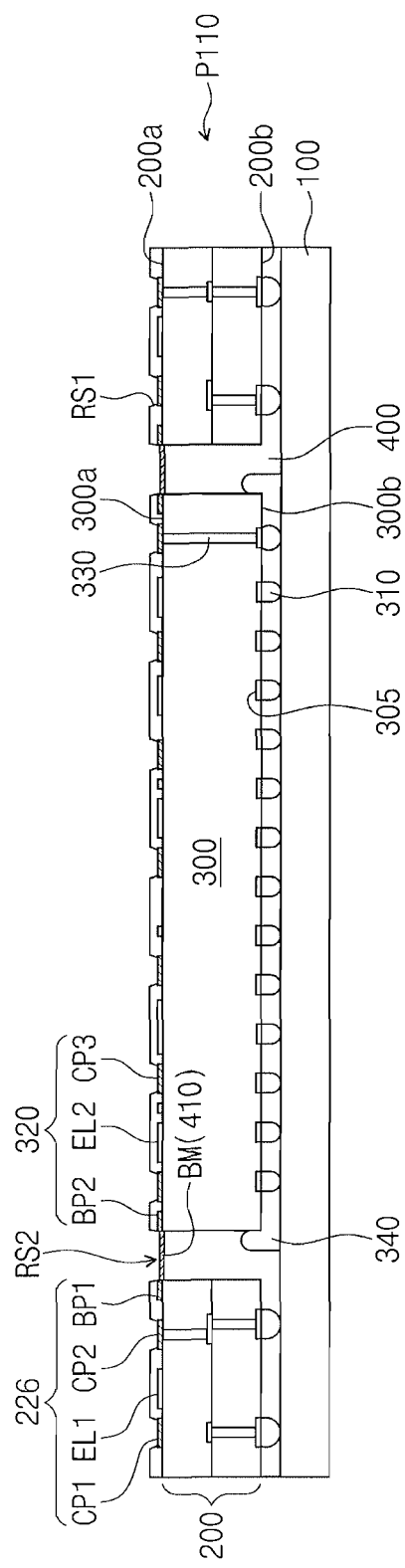

FIGS. 13 to 15 illustrate cross-sectional views showing stages in a method of manufacturing a semiconductor package, according to some example embodiments.

Referring to FIG. 13, the lower mold member 400 may be formed on a resultant structure that is fabricated as described with reference to FIG. 8. The lower mold member 400 may fill a space between the connection substrate 200 and the lower semiconductor chip 300. For example, an insulating substance may be injected into a space between the connection substrate 200 and the lower semiconductor chip 300, and then may be cured to form the lower mold member 400. The lower mold member 400 may cover the first and second conductive patterns 226 and 320.

Referring to FIG. 14, the lower mold member 400 may be etched to form the first recess RS1 and the second recess RS2. The first recess RS1 may expose the first pads CP1, the second pads CP2, and the third pads CP3. When viewed in a plan view, the second recess RS2 may be formed between the connection substrate 200 and the lower semiconductor chip 300, or between the first bonding pad BP1 of the connection substrate 200 and the second bonding pad BP2 of the lower semiconductor chip 300. The second recess RS2 may expose a lateral surface of each of the first and second bonding pads BP1 and BP2.

Referring to FIG. 15, the third conductive pattern 410 may be formed in the second recess RS2. The third conductive pattern 410 may be formed by filling the second recess RS2 with a conductive material. For example, a plating process may be performed to fill the second recess RS2 with a conductive material. In another example, a printing process, e.g., ink jet printing, may be performed to fill the second recess RS2 with a conductive material. A bottom package P100 may be formed through the processes mentioned above.

After that, the processes discussed with reference to FIG. 1 may be performed. For example, the top package P200 may be mounted on the bottom package P100 to manufacture the semiconductor package of FIG. 4.

FIGS. 16 to 23 illustrate cross-sectional views of stages in a method of manufacturing a semiconductor package, according to some example embodiments.

Referring to FIG. 16, the connection substrate 200 may be provided. The connection substrate 200 may include the base layer 210 and the conductive member 220 in the base layer 210. The conductive member 220 may include the connection substrate pads 222, the connection substrate vias 224, and the first conductive pattern 226. For example, the base layer 210 may be etched, followed by filling the etched portion with a conductive material to form the connection substrate pads 222, the connection substrate vias 224, and the first conductive pattern 226.

Referring to FIG. 17, the opening OP may be formed in the connection substrate 200. A portion of the connection substrate 200 may be removed to form the opening OP penetrating the connection substrate 200. The opening OP may be formed by, e.g., an etch process such as drilling, laser ablation, or laser cutting. The removed portion of the connection substrate 200 may be a zone in which a lower semiconductor chip 300 is provided in a subsequent process.

The connection substrate 200 may be attached onto a carrier substrate 800. For example, the carrier substrate 800 may be an insulating substrate including glass or polymer or a conductive substrate including metal. The carrier substrate 800 may have a top surface that includes an adhesive member used to adhere the carrier substrate 800 to the bottom surface 200b of the connection substrate 200. The adhesive member may include, e.g., a glue tape.

Figure 18:
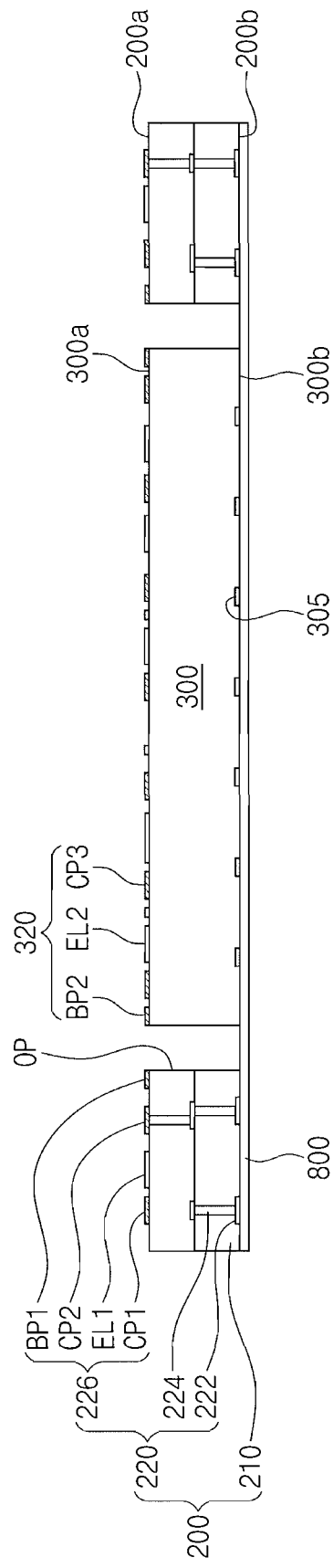

Referring to FIG. 18, the lower semiconductor chip 300 may be provided on the carrier substrate 800, e.g., within the opening OP of the connection substrate 200. The lower semiconductor chip 300 may be the same as the lower semiconductor chip 300 fabricated as described with reference to FIGS. 5 and 6. The lower semiconductor chip 300 may be provided in the opening OP of the connection substrate 200. At this stage, the lower semiconductor chip 300 may be adhered to the carrier substrate 800. The lower semiconductor chip 300 may include the lower chip pads 305 on the lower portion thereof. For example, the lower semiconductor chip 300 may have the bottom surface 300b, which corresponds to an inactive surface in contact with the carrier substrate 800.

Figure 19:
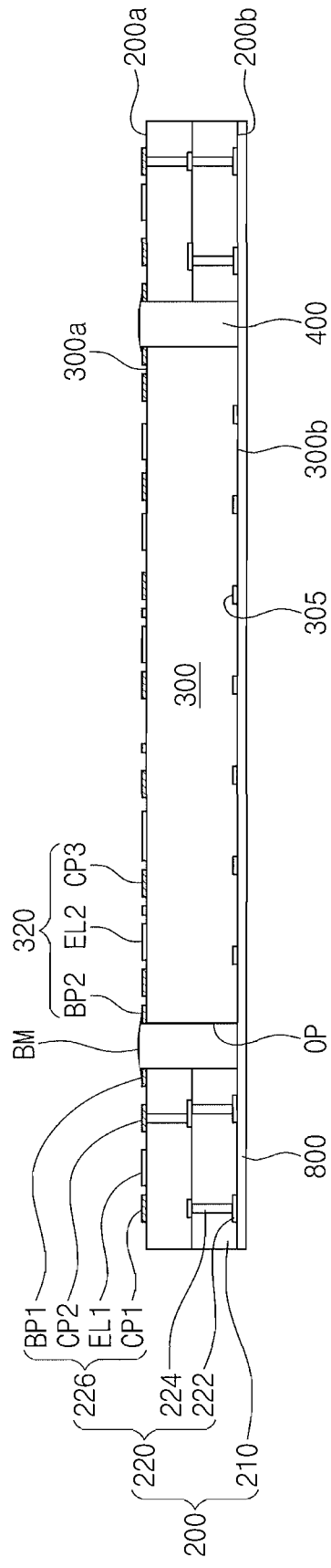

Referring to FIG. 19, the bonding member BM may be formed. For example, the first bonding pad BP1 of the connection substrate 200 and the second bonding pad BP2 of the lower semiconductor chip 300 may be connected to each other in a wire bonding manner.

Referring to FIG. 20, the lower mold member 400 may be formed on the carrier substrate 800. The lower mold member 400 may fill a space between the connection substrate 200 and the lower semiconductor chip 300. For example, an insulating substance may be injected into a space between the connection substrate 200 and the lower semiconductor chip 300, and then may be cured to form the lower mold member 400. The lower mold member 400 may cover the first conductive pattern 226 of the connection substrate 200 and the second conductive pattern 320 of the lower semiconductor chip 300.

Referring to FIG. 21, a support substrate 910 may be provided on the connection substrate 200. The support substrate 910 may be, e.g., an insulating substrate such as glass. A glue layer 920 may be used to adhere the support substrate 910 to a top surface of the lower mold member 400. The glue layer 920 may be, e.g., a resin film.

The carrier substrate 800 may be removed. The carrier substrate 800 may be removed, as designated by a dotted line, to expose the bottom surface 300b of the lower semiconductor chip 300 and the bottom surface 200b of the connection substrate 200. The carrier substrate 800 may be removed by applying a shear stress or by chemically treating the adhesive member.

Figure 22:
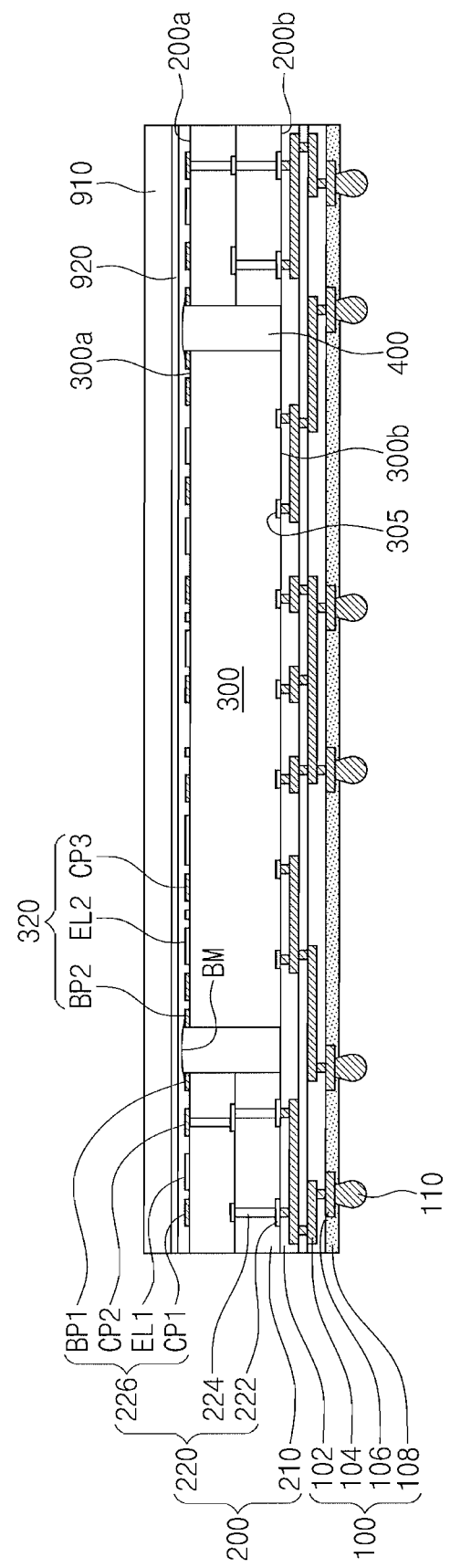

Referring to FIG. 22, the lower substrate 100 may be formed on the bottom surface 300b of the lower semiconductor chip 300 and the bottom surface 200b of the connection substrate 200. For example, a dielectric layer 102, a conductive layer 104, and substrate pads 106 may be formed on the bottom surface 300b of the lower semiconductor chip 300 and on the bottom surface 200b of the connection substrate 200, with the result that the lower substrate 100 may be fabricated. A dielectric material layer, e.g., a silicon oxide layer, may be formed on the bottom surface 300b of the lower semiconductor chip 300 and the bottom surface 200b of the connection substrate 200, and then patterned to form a portion of the dielectric layer 102. The lower chip pads 305 and the connection substrate pads 222 may be exposed by the dielectric layer 102. A conductive material layer may be formed on a bottom surface of the dielectric layer 102, and then patterned to form the conductive layer 104 and the substrate pads 106. The conductive layer 104 may be electrically connected to the lower semiconductor chip 300 and the connection substrate 200. A dielectric material layer may be formed on a bottom surface of the conductive layer 104, and then patterned to form other portion of the dielectric layer 102. At this stage, the substrate pads 106 may be exposed by the dielectric layer 102.

External terminals 110 may be formed on the exposed substrate pads 106. The external terminals 110 may include solder balls or solder bumps.

Figure 23:
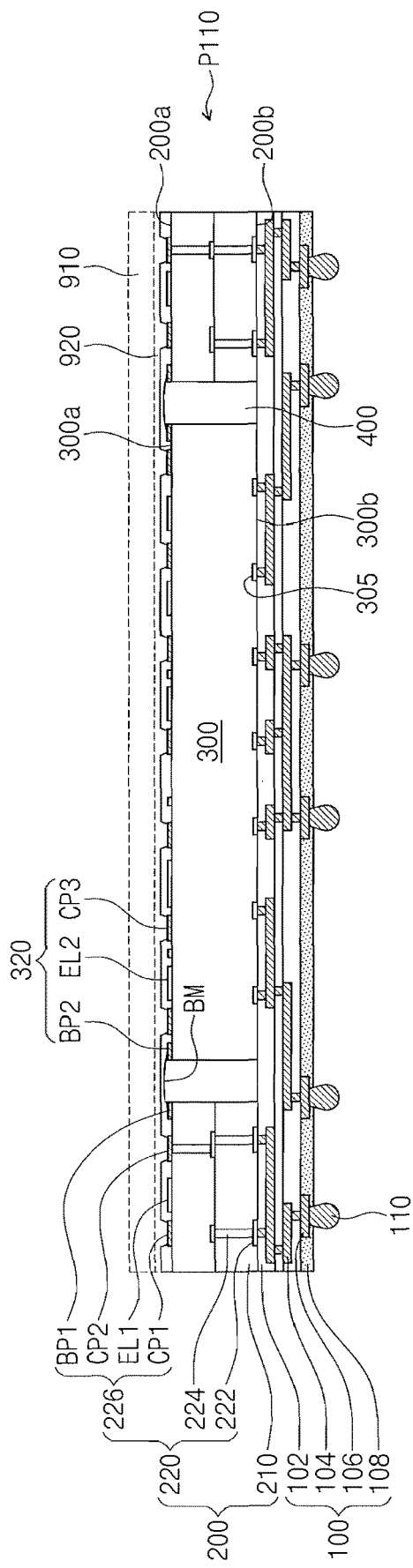

Referring to FIG. 23, the support substrate 910 may be removed. For example, the support substrate 910 may be removed by applying a shear stress or by chemically treating the glue layer 920. The support substrate 910 may be removed, as designated by a dotted line, to expose the top surface of the lower mold member 400.

The lower mold member 400 may be etched to form a first recess RS1 exposing the first pads CP1, the second pads CP2, and the third pads CP3. The bottom package P100 may be fabricated through the processes mentioned above.

After that, the processes discussed with reference to FIG. 1 may be performed. For example, the top package P200 may be mounted on the bottom package P100 to manufacture the semiconductor package of FIG. 5.

By way of summation and review, some example embodiments provide a semiconductor package with increased electrical characteristics and a method of manufacturing the same. Some example embodiments also provide a compact-sized semiconductor package and a method of manufacturing the same. Some example embodiments also provide a semiconductor package with improved thermal stability and a method of manufacturing the same.

That is, a semiconductor package according to some example embodiments may be configured such that connection terminals of a top package may all be disposed on a connection substrate and a lower semiconductor chip. Therefore, conductive patterns may redistribute an electrical circuit of the top package and may increase the degree of freedom of wiring between the top package and a bottom package.

In addition, because an additional substrate is not required for redistribution between the bottom package and the top package, the semiconductor package may decrease in thickness. As a result, the semiconductor package may have an overall reduced size. Further, a reduction in total thickness of the semiconductor package may allow the lower semiconductor chip to have an increased thickness, and thus the lower semiconductor chip may advantageously radiate heat. Furthermore, heat generated from the lower semiconductor chip may be discharged out through the conductive patterns, thereby increasing heat radiation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a lower substrate;
a connection substrate coupled to the lower substrate, the connection substrate including:
a lateral portion surrounding a cavity, and
a first conductive pattern on a top surface of the lateral portion;
a lower semiconductor chip on the lower substrate, the lower semiconductor chip being in the cavity of the connection substrate, and the lower semiconductor chip including a second conductive pattern on a top surface of the lower semiconductor chip;
a bonding member connecting the first conductive pattern and the second conductive pattern to each other; and
a top package on the first conductive pattern and the second conductive pattern, the top package including a first connection terminal and a second connection terminal below the top package, the first and second connection terminals being coupled to the first and second conductive patterns, respectively.

2. The semiconductor package as claimed in claim 1, wherein the top package includes:
an upper substrate;
an upper semiconductor chip on the upper substrate; and
the first and second connection terminals on a bottom surface of the upper substrate.

3. The semiconductor package as claimed in claim 1, wherein the second connection terminal is electrically coupled to the lower substrate through the second conductive pattern, the bonding member, and the connection substrate.

4. The semiconductor package as claimed in claim 2, wherein the first and second connection terminals are electrically insulated from the lower semiconductor chip.

5. The semiconductor package as claimed in claim 2, wherein a width of the upper semiconductor chip is greater than a width of the lower semiconductor chip.

6. The semiconductor package as claimed in claim 2, wherein each of the first and second connection terminals includes a solder ball or a solder bump.

7. The semiconductor package as claimed in claim 1, wherein the top surface of the lower semiconductor chip is an inactive surface.

8. The semiconductor package as claimed in claim 1, wherein the top surface of the lateral portion of the connection substrate and the top surface of the lower semiconductor chip are located at the same level.

9. The semiconductor package as claimed in claim 1, wherein the bonding member includes:
a bonding wire; and
a third conductive pattern between the first conductive pattern and the second conductive pattern.

10. The semiconductor package as claimed in claim 1, further comprising a lower mold member that buries, on the lower substrate, the lower semiconductor chip and the connection substrate,
wherein the lower mold member exposes the first conductive pattern and the second conductive pattern.

11. The semiconductor package as claimed in claim 1, wherein the lower semiconductor chip further includes a via that penetrates the lower semiconductor chip and electrically connects the second conductive pattern to the lower substrate.

12. The semiconductor package as claimed in claim 1, wherein the lower substrate includes a redistribution layer that is directly coupled to a lower chip pad of the lower semiconductor chip and to a substrate pad of the connection substrate.

13. A semiconductor package, comprising:
a connection substrate including:
a lateral portion surrounding a cavity,
a first conductive pattern on a top surface of the lateral portion, and
a via through the lateral portion and connected to the first conductive pattern;
a semiconductor chip in the cavity and including:
second conductive patterns on an inactive surface of the semiconductor chip, the semiconductor chip being electrically insulated from the second conductive patterns, and
an active surface opposite the inactive surface;
a bonding member electrically connecting the first conductive pattern of the connection substrate and at least a first one of the second conductive patterns of the semiconductor chip to each other;
a connection terminal on at least a second one of the second conductive patterns of the semiconductor chip; and
a top package coupled to the connection terminal.

14. The semiconductor package as claimed in claim 13, wherein the top surface of the lateral portion of the connection substrate and the inactive surface of the semiconductor chip are coplanar with each other.

15. The semiconductor package as claimed in claim 13, wherein the top package is coupled to the first conductive pattern and the second conductive pattern.

16. The semiconductor package as claimed in claim 15, wherein the connection terminal includes a first connection terminal and a second connection terminal below the top package,
wherein the first connection terminal is coupled to the first conductive pattern, and
wherein the second connection terminal is coupled to the second conductive pattern.

17. The semiconductor package as claimed in claim 15, wherein a width of the top package is the same as a width of the connection substrate.

18. The semiconductor package as claimed in claim 13, further comprising an additional substrate below the connection substrate,
- wherein the connection substrate and the semiconductor chip are coupled to the additional substrate, and
- wherein the active surface of the semiconductor chip faces the additional substrate.

* * * * *